United States Patent [19]
Hierold

[11] Patent Number: 5,304,837
[45] Date of Patent: Apr. 19, 1994

[54] MONOLITHICALLY INTEGRATED TEMPERATURE SENSOR FOR POWER SEMICONDUCTOR COMPONENTS

[75] Inventor: Christofer Hierold, Munich, Fed. Rep. of Germany

[73] Assignee: Siemens Aktiengesellschaft, Munich

[21] Appl. No.: 972,549

[22] Filed: Nov. 6, 1992

[30] Foreign Application Priority Data

Jan. 8, 1992 [DE] Fed. Rep. of Germany ....... 4200291

[51] Int. Cl.[5] .................... H01L 23/58; H01L 29/66
[52] U.S. Cl. .................... 257/470; 257/341; 257/401; 257/467
[58] Field of Search ................ 307/310; 257/108, 140, 257/337, 367, 467, 469, 470, 335, 341, 401

[56] References Cited

U.S. PATENT DOCUMENTS

| 4,760,434 | 7/1988 | Tsuzuki et al. | 257/470 |
| 5,063,307 | 11/1991 | Zommer | 307/310 |

Primary Examiner—Andrew J. James
Assistant Examiner—Nathan Kelley
Attorney, Agent, or Firm—Hill, Steadman & Simpson

[57] ABSTRACT

A temperature sensor is monolithically integrated in a semiconductor body together with a vertical power semiconductor structure. The power semiconductor structure is formed of a plurality of power cells. The temperature sensor is formed of two sensor cells that can be manufactured simultaneously with the power cells. The advantage of the invention is that a highly sensitive temperature sensor can be manufactured in process-compatible fashion together with a vertical power semiconductor structure without additional steps and in a cost-beneficial way.

7 Claims, 2 Drawing Sheets

5,304,837

MONOLITHICALLY INTEGRATED TEMPERATURE SENSOR FOR POWER SEMICONDUCTOR COMPONENTS

BACKGROUND OF THE INVENTION

The invention is directed to a monolithically integrated temperature sensor for power semiconductor components wherein a temperature sensor is monolithically integrated on a semiconductor member together with a vertical power semiconductor structure.

A temperature sensor of this type is known, for example, from a contribution to the publication "TEMP-FET: Schritt zum idealen Leistungshalbleiterschalter" in the company publication Siemens Components 27 (1989), No. 6, pages 228–232. What is involved there is a temperature sensor that is integrated with a power MOS-FET in multi-chip or hybrid technology. Beyond this, one also finds there the teaching that there is also the possibility of a monolithically integrated temperature sensor.

SUMMARY OF THE INVENTION

An object of the invention is to specify a monolithically integratable temperature sensor and a method for the manufacture thereof, whereby the temperature sensor has high sensitivity and can be manufactured simply and in space-saving fashion without additional manufacturing steps in common with and compatible to the process of the power semiconductor structure of the power semiconductor component.

According to the invention, a semiconductor is provided comprising a temperature sensor monolithically integrated on a semiconductor member together with a vertical power semiconductor structure. The power semiconductor structure has an emitter terminal, a collector terminal, and a gate terminal, and has a plurality of power cells. The temperature sensor comprises two sensor cells. The two sensor cells are manufactured in common with the plurality of power cells.

The advantage obtained with the invention is particularly comprised in that the temperature sensor of the invention can be wired both as a temperature-dependent switch as well as a nearly linear temperature-voltage converter.

DESCRIPTION OF THE PREFERRED EMBODIMENTS

Figure 1:
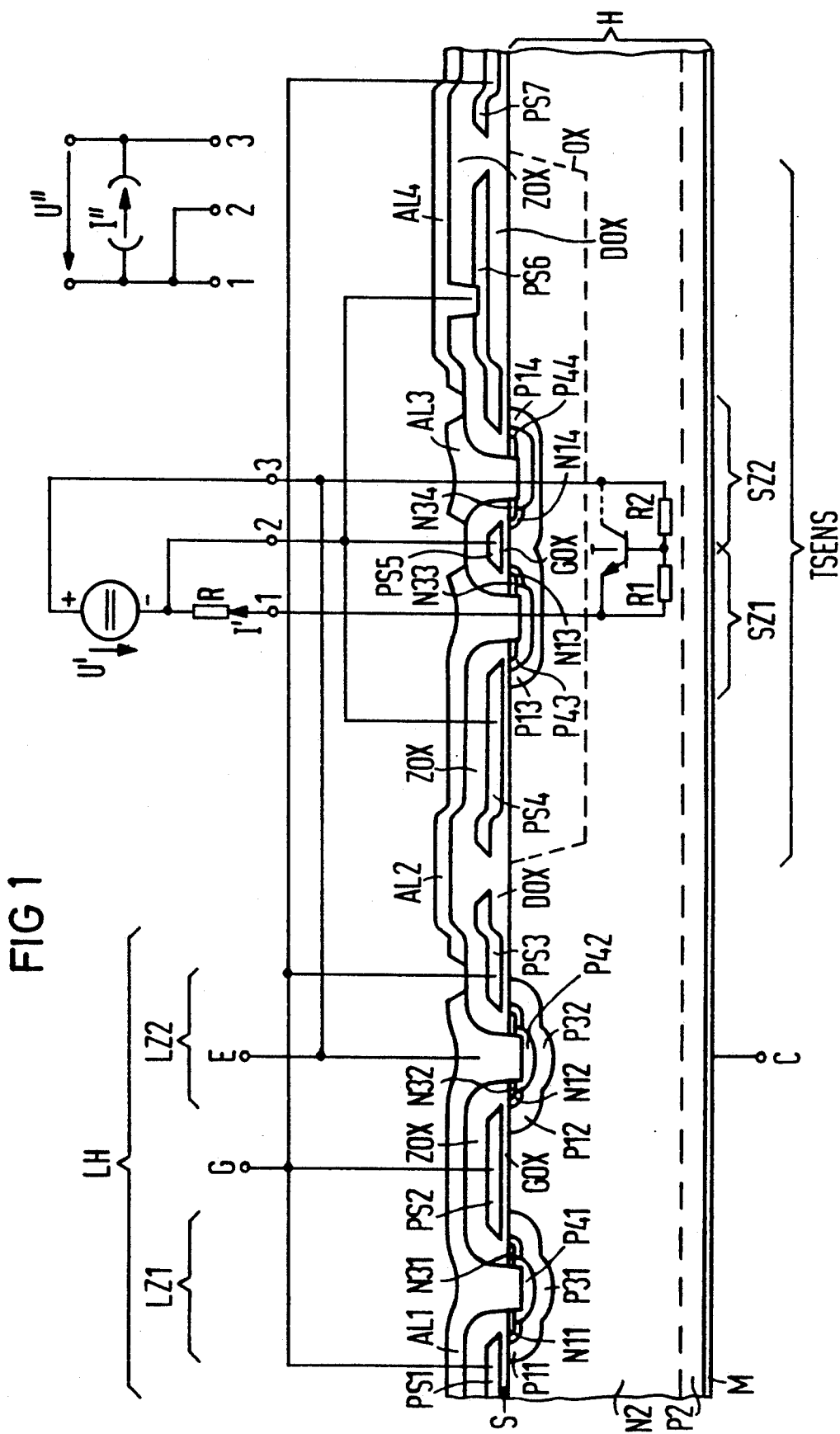
FIG. 1 is a sectional view of a temperature sensor of the invention together with a region of a vertical power semiconductor structure.

FIG. 1 shows a sectional view of a region of a semiconductor member H having two power cells LZ1 and LZ2, of a power semiconductor structure LH, and of a temperature sensor TSENS of the invention composed of two sensor cells SZ1 and SZ2. The two power cells LZ1 and LZ2 represent a plurality of power cells and the temperature sensor TSENS can be provided in multiple fashion on the semiconductor member H. The semiconductor member H here is essentially composed of an n-doped substrate N2 into which P-doped wells P11 and P12 of the power cells LZ1 and LZ2 and p-doped wells P13 and P14 of the sensor cells SZ1 and SZ2 are introduced, proceeding from a structuring surface S of the semiconductor member H. The power cell LZ1 has an n+-doped well N31 inside the well P11 and the power cell LZ2 comprises an n+-doped well N32 within the well P12. Correspondingly, the sensor cell SZ1 has an n+-doped well N33 within the well P13 and the sensor cell SZ2 has an n-doped well N34 within the well P14. The wells P11 and P12 of the power semiconductor structure are thereby separated from one another by the substrate N2. In the case of the temperature sensor TSENS, by contrast, the sensor cells SZ1 and SZ2 are arranged in such close proximity that the wells P13 and P14 merge into one another and only a narrow region of the wells P13 and P14 separates the two wells N33 and N34 from one another in the lateral direction. For improving the properties of the power semiconductor structure, an n− doped region N11 is provided between the well N31 and the well P11, this region N11 annularly surrounding a p++=doped region P41 situated between a contacting AL1 and the well P11. The well P11 that is otherwise p−-doped has a p+-doped region P31 under the region P41. Correspondingly, a ring-shaped n−-doped region N12 is provided between the well N32 and the well P12, this region N12 surrounding a p++-doped region P42 between the contacting AL1 and the well P12. The well P12 that is otherwise p−-doped correspondingly comprises a p+-doped region P32 under the region P42. The sensor cells can be designed corresponding to the power cells, whereby the wells P13 and P14 therein do not comprise p+-doped regions. It is advantageous, however, when an n−-doped region N13 between the well N33 and the well P13 does not annularly surround the well N33, but is only provided in a region where the wells P13 and P14 merge into one another and a p++-doped region P43 is otherwise present between a contacting AL2 and the well P13. The region P43 extends up to the structuring surface S and forms what is referred to as a "channel stop" between the well P13 and the well N33. The analogous case applies for an n−-doped region N14 between the well N34 and the well P14 and a p++-doped region between a contacting AL3 and the well P14. Separated from the semiconductor member H by a gate oxide GOX, at least one gate electrode PS1, PS2, PS3 and PS7 of the power semiconductor structure is located above the structuring surface S in the region of the power semiconductor structure LH. This at least one gate electrode can be designed as an interconnected region or in the form of a plurality of discrete electrodes. Correspondingly, at least one gate electrode PS4, PS5 and PS6 of the temperature sensor is present in the region of the temperature sensor TSENS. This at least one gate electrode can likewise be designed either as an interconnected region or in the form of discrete regions. The gate electrode PS1, PS2, PS3 and PS7 of the power semiconductor structure is connected to a gate terminal G and the contacting AL1 is connected to an emitter terminal E of the power semiconductor component. The contacting AL1 together with the contacting AL3 forms an interconnected region, as a result whereof there is a connection between a sensor terminal 3 and the emitter terminal E of the power semiconductor component. The contactings AL2 and AL4, by contrast, are insulated therefrom and from one another by oxide layers. In the case of the temperature sensor, the contacting AL2 is connected to a sensor terminal 1, the contacting AL3 is connected to the sensor terminal 3, and the gate electrode PS4, PS5 and PS6 of the temperature sensor is connected to a sensor terminal 2, for example via the contacting AL4, as a result whereof a bias can be applied. An intermediate or spacer oxide ZOX is situated between the contactings AL1 ... AL4, and the gate electrodes PS1 ... PS7 and the gate oxide GOX is thickened to form a thick oxide DOX at the lateral boundaries between the power semiconductor structure and the temperature sensor. A metallization layer M that is connected to a collector terminal C of the power semiconductor component and composed, for example, of AlTiNiAg, is situated on that surface of the semiconductor member H facing away from the structuring surface S.

As an alternative to the arrangement shown in FIG. 1, an arrangement is conceivable wherein both the gate electrode PS1 ... PS3 and PS7 of the power semiconductor structure as well as the gate electrode PS4 ... PS6 of the temperature sensor are connected to the gate terminal G of the power semiconductor component by an interconnected layer, for example a polysilicon layer, whereby the thick oxide DOX is not provided and whereby the sensor terminal 2 is unwired. A temperature sensor of this arrangement, however, can only be operated during the switching pauses, i.e. when the voltage between gate terminal G and the emitter terminal E amounts to approximately 0 Volts, since it otherwise carries part of the load current.

An insulation of the temperature sensor TENS from the substrate N2 can be effected by a space charge zone or by an oxide layer OX indicated with broken lines in FIG. 1. The space charge zone can be generated by a suitable voltage between the wells P13 and P14 and the substrate N2. When, as shown in FIG. 1, the wells are p-conductive and the substrate is n-conductive, then the sensor cell SZ1 must be negatively biased vis-a-vis the emitter terminal E for this purpose.

When, for example, the power semiconductor component is a power MOSFET, then the n-doped substrate N2 is directly adjacent to the metallization layer M. When, however, the power semiconductor component is an IGBT (isolated gate bipolar transistor), then a p-doped layer P2 indicated with broken lines in FIG. 1, is provided between the n-doped substrate N2 and the metallization layer M, whereby an n+-doped buffer layer is additionally present between the substrate N2 and the layer P2 given what is referred to as a "punch through IGBT".

The semiconductor member H has a vertical thickness of, for example, approximately 200 through 300 $\mu$m, and the p$^-$-doped wells P11 ... P14 have, for example, a vertical depth of approximately 6 $\mu$m. The doping concentration of the n-doped substrate amounts, for example, to $5 * 10^{13}$ cm$^{-3}$; that of the n$^-$-doped regions amounts to $10^{17}$ through $10^{18}$ cm$^3$; and that of the n+-doped regions amounts to $10^{20}$ cm$^3$; that of the p+-doped regions amounts to $10^{18}$ cm$^{-3}$; and that of the p++-doped regions amounts to $10^{19}$ cm$^{-3}$. A doping occurs, for example, with boron.

FIG. 1 also shows an approximately valid equivalent circuit diagram having a bipolar transistor T and well resistors R1 and R2, whereby the emitter terminal of the transistor T is connected to the sensor terminal 1, the collector terminal of the transistor T is connected to the sensor terminal 3, and the base terminal of the transistor T is connected via the well resistor R1 to the sensor terminal 1 and via the well resistor R2 to the sensor terminal 3. When the separating electrode PS4, PS5 and PS6 is employed as an implantation mask, then the two highly doped wells N33 and N34 are usually at such a great distance from one another that no transistor effect arises. Rather, only the base-emitter diode of the transistor T is effective together with the well resistors R1 and R2.

Since the base-emitter diode is driven via a voltage divider composed of the well resistors R1 and R2, it is only the division ratio thereof and not the absolute values of the well resistors that is relevant for the cut-in point of the base-emitter diode. The influence of the manufacturing process on the sensor properties is low and thus the reproducibility is high.

Figure 2:
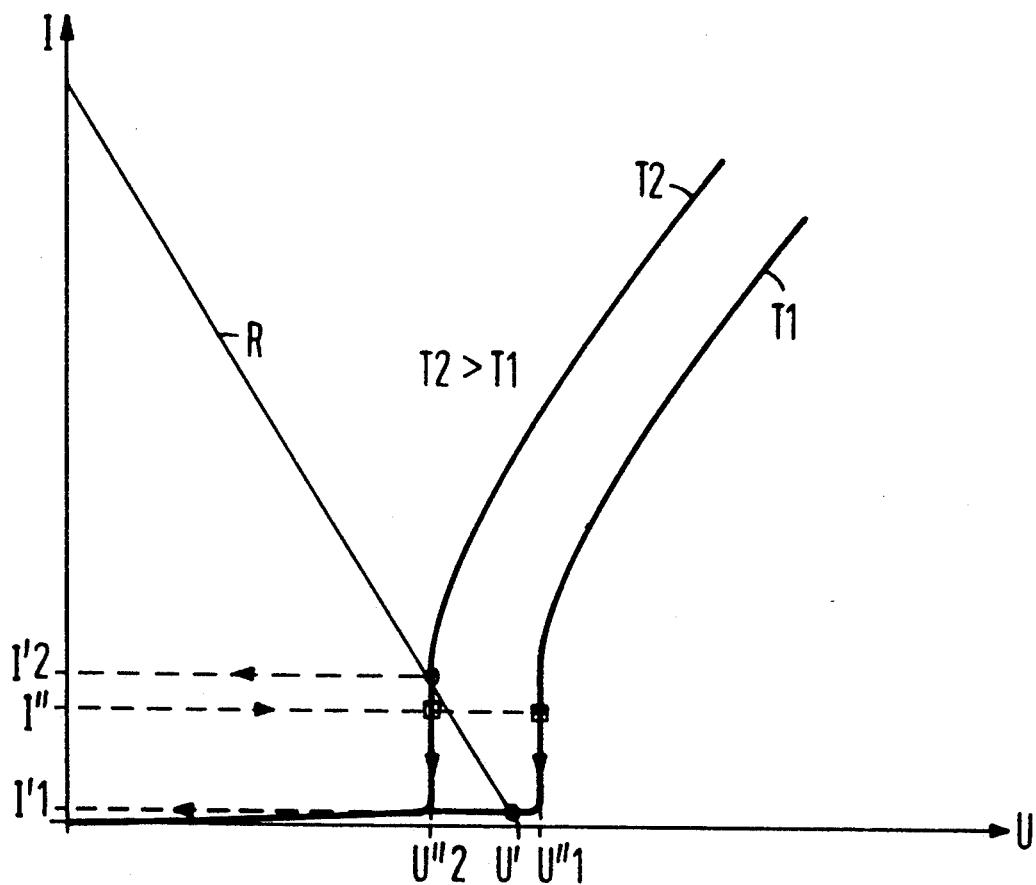
FIG. 2 is a current/voltage diagram for explaining use possibilities of the temperature sensor of the invention.

Two characteristics of the sensor of the invention are shown dependent on the temperature values T1 and T2 in a current/voltage diagram in FIG. 2 for explaining the possible uses of the temperature sensor of the invention. As a consequence of the monolithic integration of the power semiconductor structure and the temperature sensor, the sensor temperature largely corresponds to the temperature of the power semiconductor structure. When, for example as shown in FIG. 1, a voltage source having a voltage U' that typically lies between 0 and 15 V is connected via a limiting resistor R to the terminals 1 and 3 of the sensor, then the temperature sensor of the invention can be inventively employed as a temperature switch. This becomes clear from FIG. 2 in that an extremely low current I'1 derives as a result of the intersection of the resistance straight lines for the limiting resistor R and the characteristic for the lower temperature T1. A considerably higher current I'2 through the temperature sensor derives from the intersection of the resistance straight line with the characteristic for the higher temperature T2. The voltage source having the voltage U' can also be employed to suitably bias the gate electrodes PS4 ... PS6 of the temperature sensor vis-a-vis the emitter terminal E of the power semiconductor structure LH in order to prevent a conductive channel between the wells N33 and N34 or—if present—between the regions N13 and N14.

Another wiring of the temperature sensor of the invention is alternatively shown in FIG. 1. A current source that impresses a constant current I" into the sensor is connected to the terminals 1 and 3 and a temperature-dependent voltage U" arises between the sensor terminals 1 and 3. The temperature sensor of the invention can be employed as a nearly linear temperature-voltage converter, and a temperature sensitivity of approximately $-20$ mV/°K. derives, for example, given a voltage of U"$=6$ V. The sensor terminal 2 is to be connected to one of the two terminals 1 or 3 such that a suitable bias for the gate electrode of the temperature sensor results. The impressed constant current I" is shown in FIG. 2 and effects a voltage U"1 together with the characteristic for the lower temperature T1, and effects a voltage U"2 that is lower than the voltage U"1 in combination with the characteristic for the higher temperature T2.

In the inventive method for manufacturing a temperature sensor of the invention, for example, the gate oxide layer GOX and the thick oxide layer DOX are grown on the structuring surface S of the semiconductor member H, whereby the thick oxide, for example, is annularly formed around a region for the temperature sensor. For example, a polysilicon layer is applied surface-wide, for example, over the gate oxide GOX and the thick oxide DOX for the simultaneous formation of the gate electrode PS1, PS2, PS3 and PS7 of the power semiconductor structure and of the gate electrode PS4, PS5 and PS6 of the temperature sensor. This polysilicon layer is covered with a lacquer mask. In a following etching process, the polysilicon layer is removed in the region of the power cells LZ1 and LZ2 in the region of the sensor cells SZ1 and SZ2 as well as above the annular thick oxide DOX, so that the gate electrode power semiconductor structure is separated from the gate electrode of the temperature sensor. The two gate electrodes are now advantageously employed for the self-aligned implantation of a doping for forming the lightly doped wells P11 . . . P14. After a following tempering process, the wells P11 . . . P14 have a larger expanse and extent under the two gate electrodes, whereby the two lightly doped wells P13 and P14 of the sensor cells SZ1 and SZ2 merge into one another and form a common, lightly doped well. The gate electrode of the power semiconductor structure and the gate electrode of the temperature sensor can now also be utilized for a self-aligned implantation of the highly doped wells N31 . . . N34. In order to improve the power semiconductor structure, an introduction of the n⁻-doped regions N11 . . . N14 can occur in self-aligning fashion before the introduction of the highly doped wells N31 . . . N34. In order to further improve the power semiconductor structure, a generation of the p⁻-doped regions P31 and P32 at the power cells as well as of the p⁺-doped regions P41 . . . P44 can occur with the assistance of an implantation mask before the formation of the gate electrodes PS1 . . . PS7, whereby the regions N13 and N14 can be advantageously designed only between the sensor cells and the regions P43 and P44 can be advantageously designed extending annularly around the two sensor cells SZ1 and SZ2 up to the structuring surface S. When all dopings of the semiconductor member H have been carried out, the semiconductor member provided with oxide layers and electrodes is covered surface-wide with an intermediate oxide layer ZOX in which a via hole is then subsequently simultaneously etched in the region of a respective power cell and in the region of a respective sensor cell, as well as in the terminal region for the gate electrodes. Subsequently, the contactings AL1 . . . AL4 composed, for example, of aluminum, are produced in common for the power cells and for the sensor cells. When the temperature sensor TSENS is to be voltaicly separated from the power semiconductor structure LH, then a thick oxide layer can be grown in the region of the temperature sensor and an island-shaped region of the thick oxide can be reformed into silicon in order to insulate the temperature sensor TSENS from the power semiconductor LH by an oxide layer OX.

Since a part of the separating electrode PS5 provided between the two highly doped wells N33 and N34 for the formation of the p⁻-doped region cannot be arbitrarily narrow but, for example, must be a few μm for technological reasons, the part PS5 of the gate electrode of the temperature sensor can be initially omitted and the wells P13 and P14 can be implanted as one region. However, additional manufacturing steps would then have to be provided to generate highly doped wells N33 and N34 lying in extremely close proximity to one another and to generate a correspondingly narrow part PS5 of the gate electrode.

Although various minor changes and modifications might be proposed by those skilled in the art, it will be understood that I wish to include within the claims of the patent warranted hereon all such changes and modifications as reasonably come within my contribution to the art.

I claim as my invention:

1. A semiconductor device, comprising:
    a temperature sensor monolithically integrated on a semiconductor body together with a vertical power semiconductor structure;
    the power semiconductor structure comprising a first terminal, a second terminal, and a gate terminal, and having a plurality of power cells;
    the temperature sensor comprising two sensor cell portions;
    both of the two sensor cell portions as well as the plurality of power cells each comprising a lightly doped well of a first conductivity type and the respective lightly doped well containing at least one highly doped well of a second conductivity type;
    the two sensor cell portions and the plurality of power cells being introduced into a common substrate of the second conductivity type;
    both in the sensor cell portions as well as in the power cells, the highly doped well of the second conductivity type being respectively directly connected to a respective contact and the lightly doped well of the first conductivity type being connected to said respective contact via a respective intermediate region;
    the two sensor cell portions lying in close proximity side-by-side such that the lightly doped wells of the two sensor cell portions merge into one another and only a narrow, lightly doped region of the first conductivity type remains between the highly doped wells of the second conductivity type;
    the contact of the first sensor cell portion being connected to a first sensor terminal and the contact of the second sensor cell portion being connected to a second sensor terminal; and
    an electrical resistance occurring between the first and the second sensor terminals being dependent on a temperature of the plurality of power cells.

2. A semiconductor device according to claim 1 wherein the temperature sensor is electrically insulated from the power semiconductor structure by a space charge zone between the lightly doped wells and the common substrate, the space charge zone being formed by the second sensor terminal connected to the first terminal of the power semiconductor structure, the first sensor terminal having a more negative potential than the first terminal of the power semiconductor structure when the lightly doped wells are of the first conductivity type, and the first sensor terminal having a more positive potential than the first terminal of the power semiconductor structure when the lightly doped wells are of the second conductivity type.

3. A semiconductor device according to claim 1 wherein said temperature sensor is electrically insulated from the power semiconductor structure by an oxide layer.

4. A semiconductor device according to claim 1 wherein said temperature sensor is monolithically integrated with a vertical power MOSFET.

5. A semiconductor device according to claim 1 wherein said temperature sensor is monolithically integrated with an IGBT (isolated gate bipolar transistor).

6. A semiconductor device according to claim 1 wherein the temperature sensor comprises a temperature-dependent switch, a series circuit formed of a voltage source and a limiting resistor being connected to the first and second sensor terminals.

7. A semiconductor device according to claim 1 wherein the temperature sensor comprises a linear temperature/voltage converter, a current source being directly connected to the first and second sensor terminals, and a constant current being provided between the sensor terminals for effecting a temperature-dependent output voltage.

* * * * *